United States Patent [19]

Okuno et al.

[11] Patent Number: 4,677,249
[45] Date of Patent: Jun. 30, 1987

[54] PHOTOVOLTAIC DEVICE

[75] Inventors: Tetsuhiro Okuno, Nara; Masaya Hijikigawa, Yamatokoriyama, both of Japan

[73] Assignee: Sharp Corporation, Osaka, Japan

[21] Appl. No.: 850,712

[22] Filed: Apr. 11, 1986

[30] Foreign Application Priority Data

May 15, 1985 [JP] Japan ................ 60-103274

[51] Int. Cl.$^4$ .......................................... H01L 31/06
[52] U.S. Cl. ...................... 136/258; 357/30; 357/59
[58] Field of Search .............. 136/258 AM; 357/30, 357/59 C

[56] References Cited

U.S. PATENT DOCUMENTS 4,441,973  4/1984  Noguchi ................. 204/192 N
4,504,518  3/1985  Ovshinsky et al. ............ 427/38

OTHER PUBLICATIONS

H. Matsumura et al, Chapter 3.4 in *Amorphous Semiconductor Technologies & Devices* (1982), pp. 88–108.

Primary Examiner—Aaron Weisstuch
Attorney, Agent, or Firm—Flehr, Hohbach, Test, Albritton & Herbert

[57] ABSTRACT

A photovoltaic device comprises a p-type amorphous layer, an intrinsic amorphous layer, and an n-type amorphous layer formed on a conductive or insulative substrate. The intrinsic amorphous layer is formed by glow discharge decomposition in the atmosphere of silicon tetrafluoride with discharge source frequency in the range between 10 kHz and 100 kHz.

2 Claims, 3 Drawing Figures

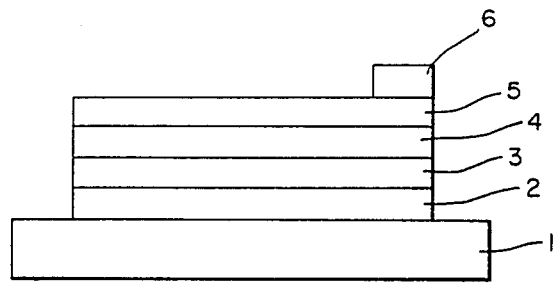
FIG.—1
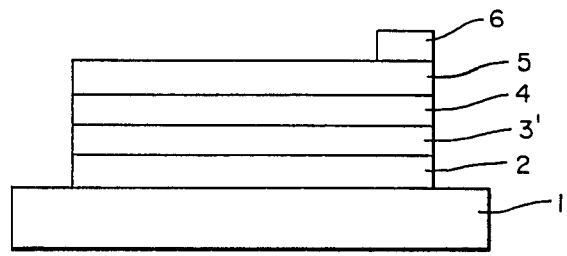
FIG.—3 (PRIOR ART)
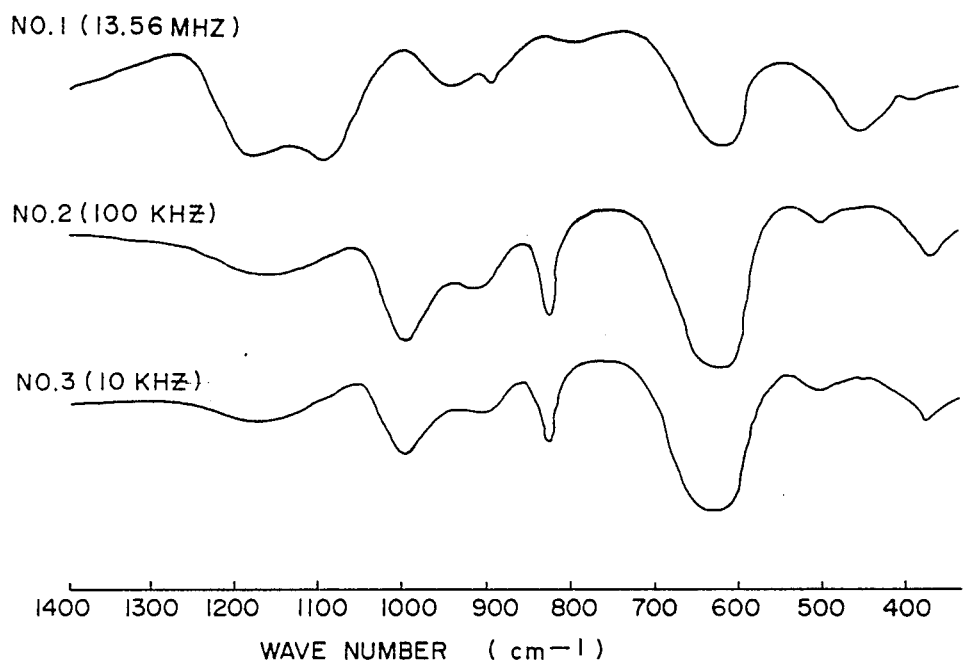
FIG.—2

PHOTOVOLTAIC DEVICE

This invention relates to a photovoltaic device which includes amorphous semiconductor layers.

In general, a photovoltaic, device with amorphous semiconductor layers comprises, as shown in FIG. 3, a p-type amorphous layer 2, an intrinsic amorphous layer 3' and an n-type amorphous layer 4 stacked on top of a conductive or insulative substrate 1, and a transparent conductive film 5 with an overlying electrode 6 formed on the n-type amorphous layer 4 by vapor deposition. The amorphous layers 2, 3' and 4 are formed by the glow discharge decomposition of monosilane gas and the discharge source frequency for the glow discharge is usually 13.56 MHz.

Characteristics of films made from monosilane gas, however, are known to deteriorate when they are irradiated with light (Staebler-Wronski effect). Films made from silicon tetrafluoride (SiF$_4$) do not exhibit the Staebler-Wronski effect very much but their characteristics are currently inferior to those of monosilane films.

The present inventors therefore attempted to use silicon tetrafluoride gas to obtain a film with quality as good as that of a film from monosilane but discovered that the photoconductivity a film obtained by a glow discharge decomposition method with discharge source frequency of 13.56 MHz in a silicon tetrafluoride gas atmosphere was rather small. The ratio of photoconductivity to the dark current conductivity was as shown in Table 1 (No. 1) and hence this film is not sufficiently good to be used as the intrinsic layer of a photovoltaic device. In order to obtain a film with superior characteristics by decomposing silicon tetrafluoride gas, therefore, process conditions different from those for monosilane gas must be considered.

It is therefore an object of the present invention to provide a photovoltaic device with a film of superior characteristics formed by glow discharge decomposition in a silicon tetrafluoride gas atmosphere.

The above and other objects of the present invention are attained by providing a photovoltaic device with a p-type amorphous layer, an intrinsic amorphous layer and an n-type amorphous layer formed on a conductive or insulative substrate where the aforementioned intrinsic amorphous layer is formed by glow discharge decomposition in a silicon tetrafluoride atmosphere at power frequency in the range of about 10 kHz to about 100 kHz.

The accompanying drawings, which are incorporated in and form a part of the specification, illustrate an embodiment of the present invention and, together with the description, serve to explain the principles of the invention. In the drawings:

FIG. 1 is a diagram showing the structure of a photovoltaic device of the present invention, FIG. 2 is a graph of infrared absorption spectra of a layer according to the present invention and a prior art layer, and FIG. 3 is a diagram showing the structure of a prior art photovoltaic device.

As shown in FIG. 1, a photovoltaic device according to the present invention comprises a p-type amorphous layer 2, an intrinsic amorphous layer 3, an n-type amorphous layer 4, a transparent conductive film 5 and an electrode 6 formed on a conductive or insulative substrate 1. A stainless steel or aluminum substrate is usually used as the conductive substrate. A glass or polymer film is likewise used as the insulative substrate. The intrinsic layer 3 is formed by glow discharge decomposition in a gas mixture of silicon tetrafluoride and hydrogen at pressure of about 0.1 to about 10 Torr and substrate temperature about 200° to about 400° C. with discharge power frequency in the range of about 10 kHz to about 100 kHz. The p- and n-type layers 2 and 4 are formed like the intrinsic layer 3 by a glow discharge decomposition method under conditions, for example, of substrate temperature about 200° C., pressure about 1 Torr and power of discharge about 20 W. The gas flow rate may be typically 10 sccm for silane and 90 sccm for hydrogen with the ratio PH$_3$/SiH$_4$=0.3% for the n-type layer 4 and B$_2$H$_6$/SiH$_4$=1% for the p-type layer 2. The transparent conductive film 5 may be an ITO (indium-tin oxide) layer formed by election beam heating or sputtering. The electrode 6 may be of aluminum and formed likewise by electron beam heating or sputtering.

Table 1 shows the characteristics of three films Nos. 1, 2, and 3 formed by glow discharges in an atmosphere of silicon tetrafluoride. The discharge source frequency is 13.56 MHz for No. 1, about 100 kHz for No. 2 and about 10 kHz for No. 3, but the substrate temperature (350° C.), the gas composition (SiF$_4$+H$_2$) and the gas pressure (1 Torr) are the same for all three. The light source for the photoconductivity measurements was a He-Ne laser (300 $\mu$W/cm$^2$).

TABLE 1

| Sample | Frequency | Dark Current Conductivity (in ohm-cm) | Photoconductivity (in ohm-cm) |
|---|---|---|---|
| No. 1 | 13.56 MHz | $5.5 \times 10^{-9}$ | $5.0 \times 10^{-8}$ |
| No. 2 | 100 KHz | $1.5 \times 10^{-11}$ | $1.1 \times 10^{-5}$ |
| No. 3 | 10 KHz | $8.0 \times 10^{-11}$ | $5.0 \times 10^{-6}$ |

Table 1 shows clearly that both the photoconductivity and its ratio to the dark current conductivity improve significantly if the discharge power frequency is chosen between about 10 kHz and about 100 kHz. Moreover, the characteristics of Sample No. 2 are nearly the same as those of the ordinary monosilane film (dark current conductivity about 10$^{-10}$ ohm-cm and photoconductivity of about 1$\times$10$^{-5}$ ohm-cm).

FIG. 2 shows the infrared absorption spectra of the aforementioned three films. Only the first film (No. 1) shows a large absorption peak at about 1200 cm$^{-1}$ to about 1100 cm$^{-1}$ related to oxygen and it is known that this absorption peak grows larger if the film is left in the atmosphere. By contrast, Nos. 2 and 3 do not exhibit this phenomenon.

It can therefore be concluded that a stable film with high photoconductivity and large ratio between photoconductivity and dark current conductivity can be obtained if an intrinsic amorphous layer for a photovoltaic device is made by using a silicon tetrafluoride gas for a glow discharge decomposition process with discharge power frequency in the range between about 10 kHz and about 100 kHz. The characteristics of a film thus obtained are nearly the same as those of a prior art monosilane film. Since the discharge source frequency is lowered according to the present invention, no high frequency shields are needed for the chemical vapor deposition apparatus.

The foregoing description of a preferred embodiment of the invention has been presented for purposes of illustration and description. It is not intended to be exhaustive or to limit the invention to the precise form disclosed, and obviously many modifications and variations are possible in light of the above teaching. Such modifications and variations which may be apparent to a person skilled in the art are intended to be included within the scope of this invention.

What is claimed is:

1. A photovoltaic device comprising a p-type amorphous semiconductor layer, an intrinsic amorphous semiconductor layer, and an n-type amorphous semiconductor layer successively formed over a conductive or insulative substrate, said intrinsic amorphous semiconductor layer being formed by glow discharge decomposition in an atmosphere including silicon tetrafluoride gas with discharge power frequency between about 10 kHz and 100 kHz.

2. The photovoltaic device of claim 1 further comprising a transparent conductive film and an electrode.

* * * * *